(12) United States Patent
Lee et al.

(10) Patent No.: US 8,580,698 B2
(45) Date of Patent: Nov. 12, 2013

(54) METHOD FOR FABRICATING A GATE DIELECTRIC LAYER

(75) Inventors: Wei-Yang Lee, Taipei (TW); Xiong-Fei Yu, Hsinchu (TW); Jian-Hao Chen, Hsinchu (TW); Cheng-Hao Hou, Hsinchu (TW); Da-Yuan Lee, Jhubei (TW); Kuang-Yuan Hsu, Fongyuan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 612 days.

(21) Appl. No.: 12/760,297

(22) Filed: Apr. 14, 2010

(65) Prior Publication Data
US 2011/0256731 A1   Oct. 20, 2011

(51) Int. Cl.
*H01L 21/31* (2006.01)

(52) U.S. Cl.
USPC ............................................ 438/769; 438/770

(58) Field of Classification Search
None
See application file for complete search history.

(56) References Cited

U.S. PATENT DOCUMENTS

| | | | |
|---|---|---|---|
| 2005/0124109 A1* | 6/2005 | Quevedo-Lopez et al. | ... 438/240 |
| 2005/0233598 A1* | 10/2005 | Jung et al. | ...... 438/785 |
| 2006/0019033 A1* | 1/2006 | Muthukrishnan et al. | . 427/248.1 |
| 2012/0094504 A1* | 4/2012 | Yao et al. | ...... 438/763 |

* cited by examiner

*Primary Examiner* — Zandra Smith
*Assistant Examiner* — Pamela E Perkins
(74) *Attorney, Agent, or Firm* — Lowe Hauptman & Ham, LLP

(57) ABSTRACT

A method for fabricating the gate dielectric layer comprises forming a high-k dielectric layer over a substrate; forming an oxygen-containing layer on the high-k dielectric layer by an atomic layer deposition process; and performing an inert plasma treatment on the oxygen-containing layer.

20 Claims, 6 Drawing Sheets

METHOD FOR FABRICATING A GATE DIELECTRIC LAYER

TECHNICAL FIELD

This disclosure relates to integrated circuit fabrication, and more particularly to a semiconductor device with a gate dielectric layer.

BACKGROUND

The semiconductor integrated circuit (IC) industry has experienced rapid growth. Technological advances in IC materials and design have produced generations of ICs where each generation has smaller and more complex circuits than the previous generation. As the dimensions of transistors decrease, the thickness of the gate dielectric layer must be reduced to maintain performance with the decreased gate length. However, in order to reduce gate leakage, high dielectric constant (high-k) gate dielectric layers are used which allow greater physical thicknesses while maintaining the same effective thickness as would be provided by a gate dielectric layer used in future technology nodes.

FIGS. 1A-1B show cross-sectional views of a conventional high-k gate dielectric layer 112 of a semiconductor device 100 at various stages of fabrication. FIG. 1A illustrates a high-k gate dielectric layer 112 is formed over a substrate 102. The high-k gate dielectric layer 112 may be formed using an atomic layer deposition (ALD) process. The ALD process comprises a sequence of ALD cycles, with each cycle including a step of introducing a metal source chemical to form a chemi-sorption layer over top surface of the substrate 102, a residual metal source chemical purge step, a step of introducing an oxygen source chemical that reacts with the chemi-sorption layer under suitable temperature and pressure conditions to form a portion of the high-k gate dielectric layer 112, and a residual oxygen source chemical purge step. After the deposition process, vacancies 112a and impurities 112b from both source chemicals are embedded in the high-k gate dielectric layer 112.

And then, an oxygen-containing plasma treatment 180 (shown in FIG. 1B) is performed on the high-k gate dielectric layer 112. During the plasma treatment 180, oxygen radicals in the oxygen-containing plasma may penetrate through the high-k gate dielectric layer 112 to fill the vacancies 112a and replace the impurities 112b in the high-gate dielectric layer 112.

However, problems arise if excess oxygen radicals penetrate through the high-k gate dielectric layer 112 and reach the top surface of the substrate 102, an unwanted silicon oxide 112c may be formed on the top surface of the substrate 102, thereby increasing effective thickness of the high-k gate dielectric layer 112. Thus, the device performance characteristics such as threshold voltage may degrade.

Accordingly, what is needed is a method for fabricating a high-k gate dielectric layer having no unwanted silicon oxide.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1A:
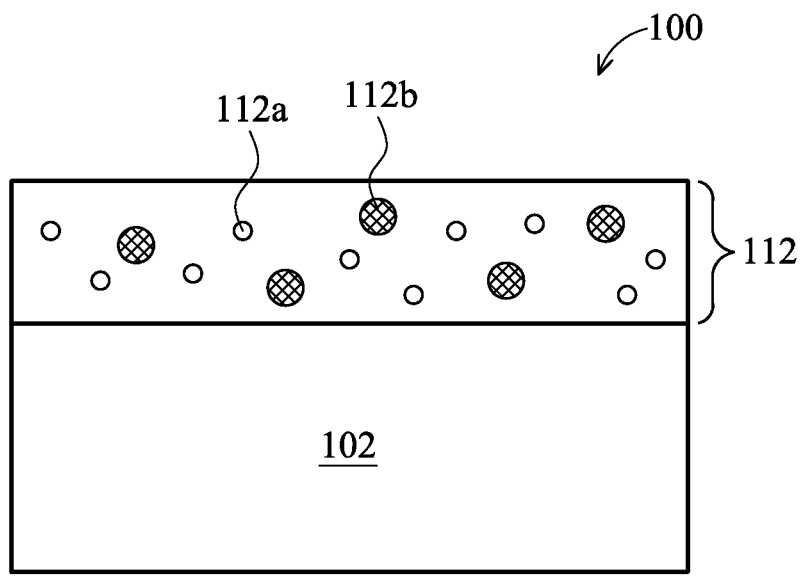
FIGS. 1A-B show cross-sectional views of a conventional high-k gate dielectric layer of a semiconductor device at various stages of fabrication.
Figure 1B:
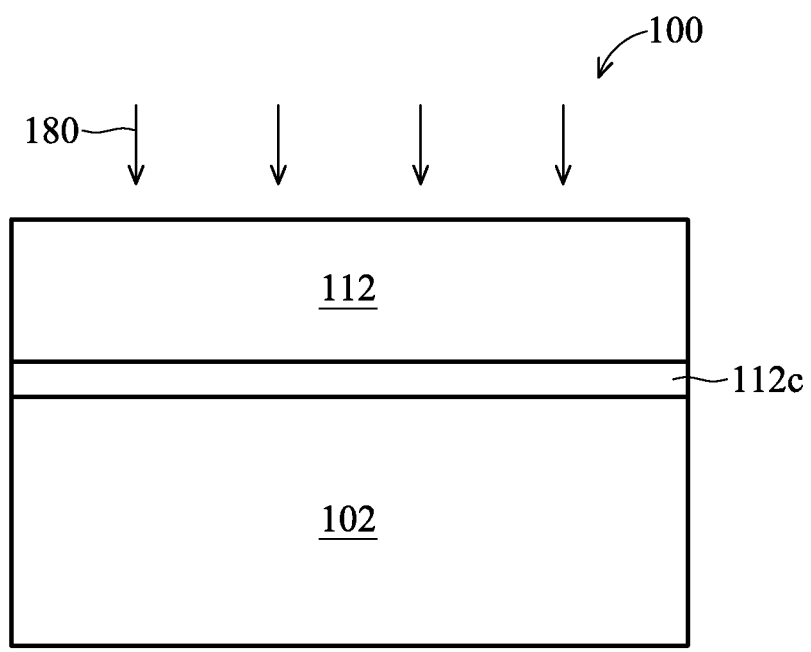

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
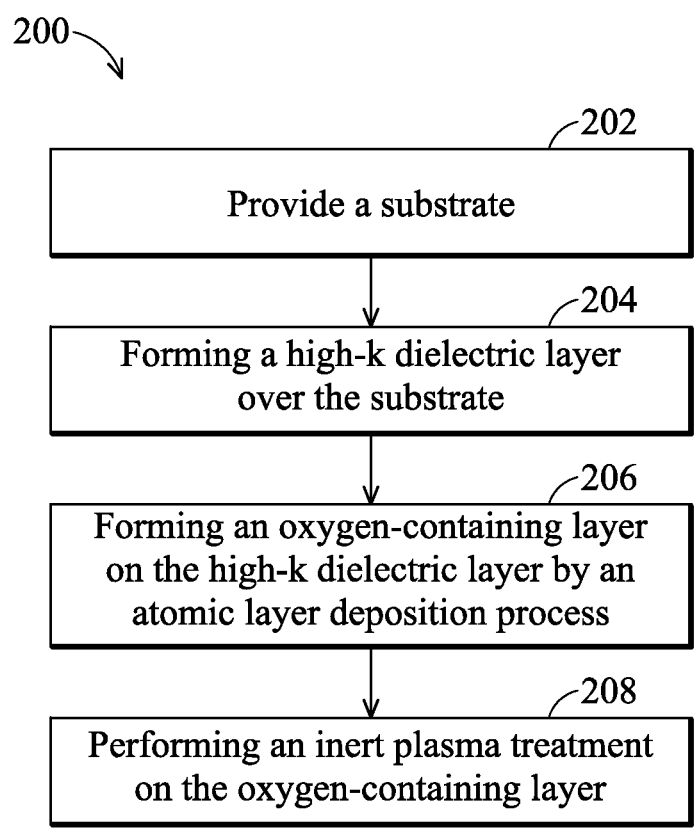
FIG. 2 is a flowchart illustrating a method for fabricating a high-k gate dielectric layer according to various aspects of the present disclosure.

FIG. 2 is a flowchart illustrating a method 200 for fabricating a high-k gate dielectric layer 312 (shown in FIG. 3) according to various aspects of the present disclosure. FIGS. 3A-3H show schematic cross-sectional views of a semiconductor device 300 at various stages of fabrication according to various aspects of the present disclosure. It is understood that other parts of the semiconductor device 300 may be fabricated with normal complementary metal-oxide-semiconductor (CMOS) technology processes, and thus some example CMOS processes are briefly described herein. Also, FIGS. 2 through 3H are simplified for a better understanding of the inventive concepts of the present disclosure. For example, although the figures illustrate the high-k gate dielectric layer 312 for the semiconductor devices 300, it is understood a semiconductor device fabricated using methods in accordance with the disclosure may be part of an integrated circuit (IC) that may include a number of other devices including resistors, capacitors, inductors, fuses, etc.

Figure 3A:
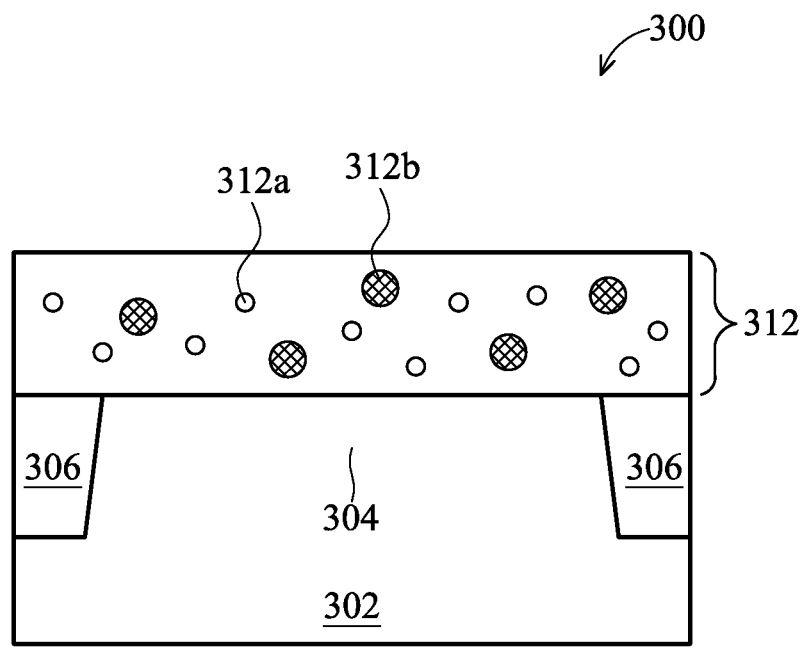
FIGS. 3A-3H show schematic cross-sectional views of the semiconductor device at various stages of fabrication according to various aspects of the present disclosure.

Referring to FIGS. 2 and 3A, the method 200 begins at step 202 wherein a portion of a substrate 302 having active regions 304 and isolation regions 306 is provided. In one embodiment, the substrate 302 comprises a crystalline silicon substrate (e.g., wafer). The substrate 302 may include various doping configurations depending on design requirements (e.g., p-type substrate or n-type substrate). The substrate 302 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 302 may include an epitaxial layer (epi layer), may be strained for performance enhancement, and/or may include a silicon-on-insulator (SOI) structure.

The active regions 304 may include various doping configurations depending on design requirements as known in the art. In some embodiments, the active regions 304 may be doped with p-type or n-type dopants. For example, the active regions 304 may be doped with p-type dopants, such as boron or $BF_2$; n-type dopants, such as phosphorus or arsenic; and/or combinations thereof. The active regions 304 may be configured for an N-type metal-oxide-semiconductor transistor device (referred to as an NMOS), or alternatively configured for a P-type metal-oxide-semiconductor transistor device (referred to as a PMOS).

The isolation regions 306 may be formed on the substrate 302 to isolate the various active regions 304. The isolation regions 306 may utilize isolation technology, such as local oxidation of silicon (LOCOS) or shallow trench isolation (STI), to define and electrically isolate the various active regions 304. In the present embodiment, the isolation region 306 includes a STI. The isolation regions 306 may comprise silicon oxide, silicon nitride, silicon oxynitride, fluoride-doped silicate glass (FSG), a low-K dielectric material, other suitable materials, and/or combinations thereof. The isolation regions 306, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 2 and 3A, the method 200 continues with step 204 in which a high-k dielectric layer 312 is formed over the substrate 302. A high-k dielectric material is defined as a dielectric material with a dielectric constant greater than that of $SiO_2$. The high-k dielectric layer 312 comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer 312 has a thickness of about 1 nm to about 4 nm. In the present embodiment, the high-k dielectric layer 312 comprises a hafnium oxide layer and hereinafter also referred to as a hafnium oxide layer 312.

The high-k gate dielectric layer 312 may be formed using any suitable process, including the processes described herein. In the present embodiment, the high-k gate dielectric layer 312 deposited over the substrate 302 is performed using an atomic layer deposition (ALD) process. In an ALD process, the high-k gate dielectric layer 312 is formed by providing alternating pulses of metal source chemicals and oxygen source chemicals to the reaction chamber. Each pulse of reactants saturates the surface in a self-limiting manner.

An exemplary ALD process in which a high-k gate dielectric layer 312 of hafnium oxide layer 312 is formed comprises the following steps. First, the semiconductor substrate 302 is loaded into a reaction chamber. Then, a pulse of hafnium source chemical is injected into the reaction chamber loaded with the semiconductor substrate 302 for a first period of time at a temperature of about 250° C. to 350° C. Here, the hafnium source chemical may be selected from the group consisting of $HfCl_4$, TEMAH (tetra-ethyl-methyl amino hafnium), $Hf(MMP)_4$ [tetra(1-methoxy2-methyl2-propoxy)Hf], and mixtures thereof. As the hafnium source chemical is injected into the reaction chamber, a chemi-sorption layer of the hafnium source chemical is formed on top surface of the semiconductor substrate 302. Then, any residual hafnium source chemical is discharged from the reaction chamber for a second period of time. To more effectively discharge the residual hafnium source chemical from the reaction chamber, purge gas may be injected into the reaction chamber during this purging period, wherein the purge gas may include a substantially inert gas such as $N_2$, Ar, He, or similar inert gases.

After discharging the residual hafnium source chemical from the reaction chamber, a pulse of oxygen source chemical is injected into the reaction chamber for a third period of time at a temperature of about 250° C. to 350° C. Here, the oxygen source chemical may be selected from the group consisting of $O_2$, $O_3$, $H_2O$, $H_2O_2$, and mixtures thereof. The oxygen source chemical reacts with the chemi-sorption layer of the hafnium source chemical at a temperature of about 250° C. to 350° C. As a result, an atomic layer of hafnium oxide is formed on the semiconductor substrate 302. Then, any residual oxygen source chemical is discharged from the reaction chamber for a fourth period of time. To more effectively discharge the residual oxygen source chemical from the reaction chamber during this second purging period, a substantially inert gas such as $N_2$, Ar, He, or the like may be injected into the reaction chamber.

Normally, the ALD process comprises a sequence of ALD cycles, i.e., the first through fourth time periods, as described above, during which each of the hafnium source chemical and the oxygen source chemical is alternately injected into and thereafter discharged from the reaction chamber, when taken together are regarded as one deposition or layer formation cycle. By repeating this cycle multiple times, the hafnium oxide layer 312 with a desired thickness is thereby formed. The hafnium oxide layer 312 may have a thickness of about 1 nm to 4 nm. After the deposition process, vacancies 312a and impurities 312b from both source chemicals are embedded in the hafnium oxide layer 312.

Figure 3B:
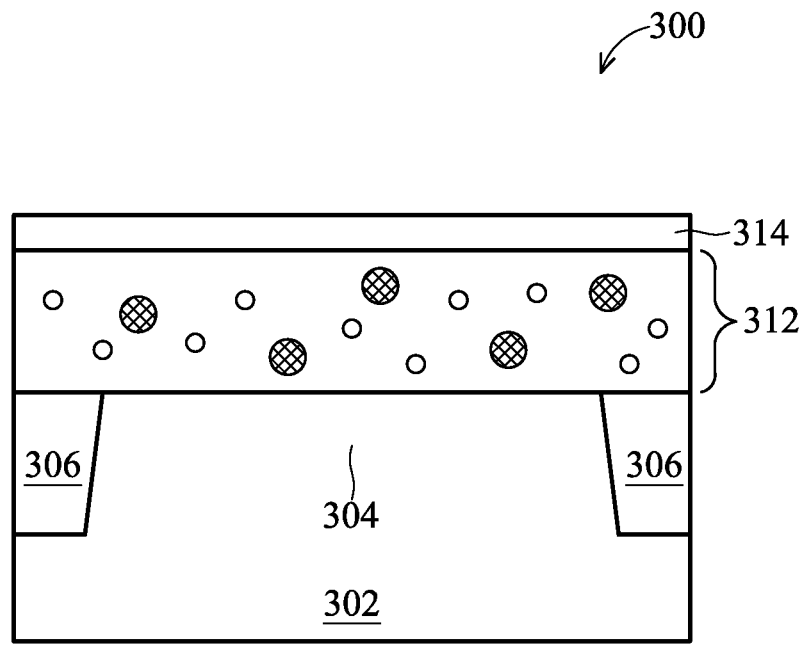

Referring to FIGS. 2 and 3B, the method 200 continues with step 206 in which an oxygen-containing layer 314 without metallic element is formed on the high-k dielectric layer 312 by an atomic layer deposition process. In the present embodiment, a pulse of oxygen source chemical is injected into the reaction chamber for a fifth period of time. Here, the oxygen source chemical of the oxygen-containing layer 314 may comprise a material selected from the group consisting of $O_2$, $O_3$, $H_2O$, and $H_2O_2$. As the oxygen source chemical is injected into the reaction chamber, an oxygen-containing layer 314 adheres to top surface of the hafnium oxide layer 312. Then, any residual oxygen source chemical is discharged from the reaction chamber for a sixth period of time. To more effectively discharge the residual oxygen source chemical from the reaction chamber during this third purging period, a substantially inert gas such as $N_2$, Ar, He, or the like may be injected into the reaction chamber.

The ALD process may comprise a sequence of ALD cycles, i.e., the fifth through sixth time periods, as described above, during which each of the oxygen source chemical is injected into and thereafter discharged from the reaction chamber, when taken together are regarded as one oxygen-containing layer 314 formation cycle. By repeating this cycle multiple times, the oxygen-containing layer 314 with a desired thickness is thereby formed. It is noted that the steps of forming a high-k dielectric layer 312 over a substrate 302 and forming an oxygen-containing layer 314 on the high-k dielectric layer 312 may be performed using different oxygen source chemical. For example, the former use $H_2O$ as oxygen source chemical to form the high-k dielectric layer 312, but the later use $O_2$ as oxygen source chemical to form the oxygen-containing layer 314.

Figure 3C:
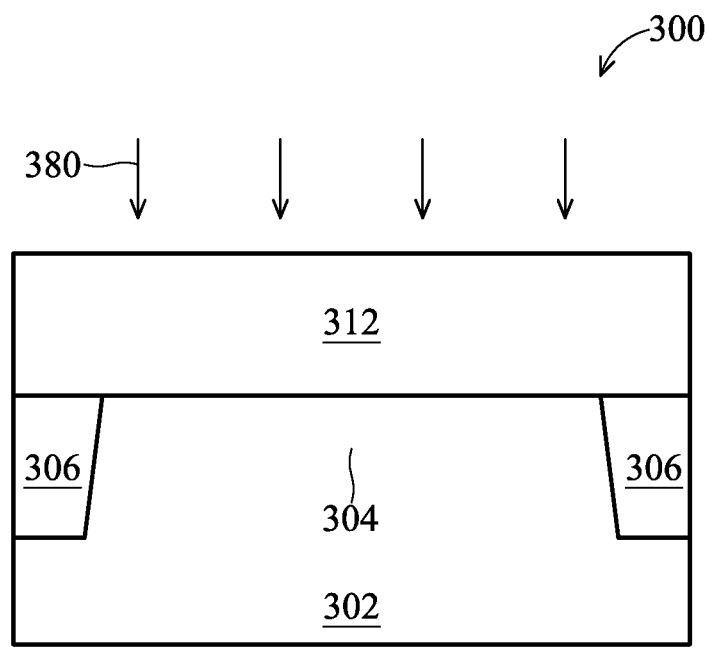

Referring to FIGS. 2 and 3C, the method 200 continues with step 208 in which an inert plasma treatment 380 is performed on the oxygen-containing layer 314. In the present embodiment, the step of performing an inert plasma treatment 380 on the oxygen-containing layer 314 is performed under a source power of about 20 to 500 W and a pressure of about 100 mTorr to 10 Torr, using $N_2$, Ar, or He as a source gas. During the inert plasma treatment 380, oxygen radicals in the oxygen-containing layer 314 may be driven into the hafnium oxide layer 312 to fill the vacancies 312a and replace the impurities 312b in the hafnium oxide layer 312. Since the supply of oxygen radical is self-limited by the thickness of the oxygen-containing layer 314, the amount of oxygen radicals can be adjusted so there is no excess oxygen radicals that can penetrate through the hafnium oxide layer 312 and reach the top surface of the substrate 302, thereby the unwanted silicon oxide on the top surface of the substrate 302 that increase effective thickness of the gate dielectric can be avoided. Thus, the disclosed method may maintain the device performance characteristics such as threshold voltage.

The high-k gate dielectric layer 312 may further comprise an interfacial layer (not shown) to minimize stress between the high-k gate dielectric layer 312 and the substrate 302. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen. The interfacial layer may alternatively be formed by an ALD process or formed by a series of wet and/or dry surface treatments. The interfacial layer may have a thickness in a range from about 0.2 nm to 0.8 nm.

Figure 3D:
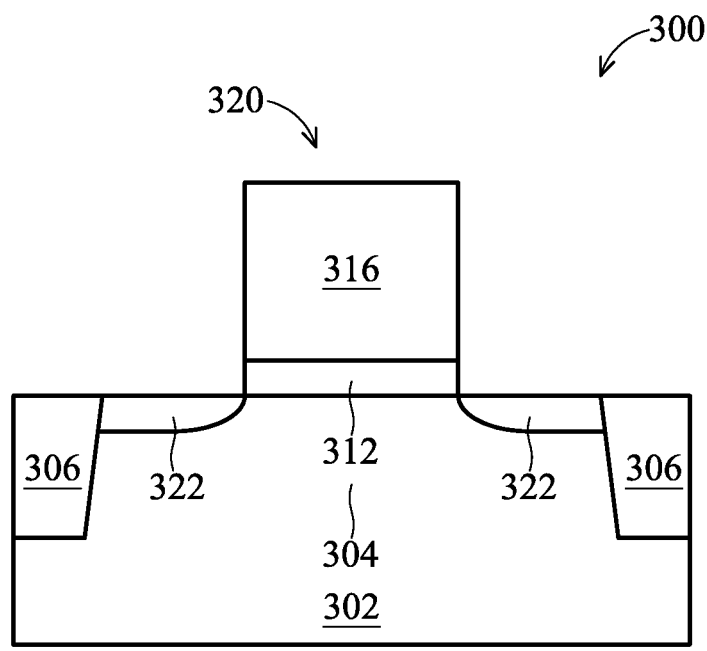

After the steps shown in FIGS. 3A-3C have been performed, then transistor fabrication may be completed using standard CMOS fabrication techniques. For example, FIGS. 3D-3H illustrate further processing performed to fabricate the semiconductor device 300 using a "gate last" CMOS process. Referring now to FIG. 3D, a dummy gate electrode layer 316 may be formed over the high-k gate dielectric layer 312. In some embodiments, the dummy gate electrode layer 316 may comprise a single layer or multilayer structure. In the present embodiment, the dummy gate electrode layer 316 may comprise poly-silicon. Further, the dummy gate electrode layer 316 may be doped poly-silicon with the uniform or gradient doping. The dummy gate electrode layer 316 may have a thickness in the range of about 30 nm to about 60 nm. The dummy electrode layer 316 may be formed using a low-pressure chemical vapor deposition (LPCVD) process. In one embodiment, the LPCVD process can be carried out in a standard LPCVD furnace at a temperature of about 580° C. to 650° C. and at a pressure of about 200 mTorr to 1 Torr, using silane ($SiH_4$) or dichlorosilane ($SiH_2Cl_2$) as the silicon source gas.

Then, a layer of photoresist is formed over the dummy gate electrode layer structure 316 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the high-k gate dielectric layer 312 and the dummy gate electrode layer 316) to form a gate structure 320. The photoresist layer may be stripped thereafter. In another example, a hard mask layer is formed over the gate structure 320; a patterned photoresist layer is formed on the hard mask layer; the pattern of the photoresist layer is transferred to the hard mask layer and then transferred to the dummy gate electrode layer 316 and the high-k gate dielectric layer 312 to form the gate structure 320. It is understood that the above examples do not limit the processing steps that may be utilized to form the gate structure 320. It is further understood that the gate structure 320 may comprise additional dielectric layers and/or conductive layers. For example, the gate structure 320 may comprise interfacial layers, capping layers, diffusion/barrier layers, other suitable layers, and/or combinations thereof.

Still referring to FIG. 3D, lightly doped source/drain (LDD) regions 322 may be formed in the active regions 304 of the substrate 302. The LDD regions 322 may be formed in the active regions 304 by one or more ion implantation processes. The doping species may depend on the type of device being fabricated, such as an NMOS or PMOS device. For example, the LDD regions 322 may doped with p-type dopants, such as boron or $BF_2$; n-type dopants, such as phosphorus or arsenic; and/or combinations thereof. The LDD regions 322 may comprise various doping profiles. The LDD regions 322 may be aligned with an outer edge of the gate structure 320 following the ion implantation process.

Figure 3E:
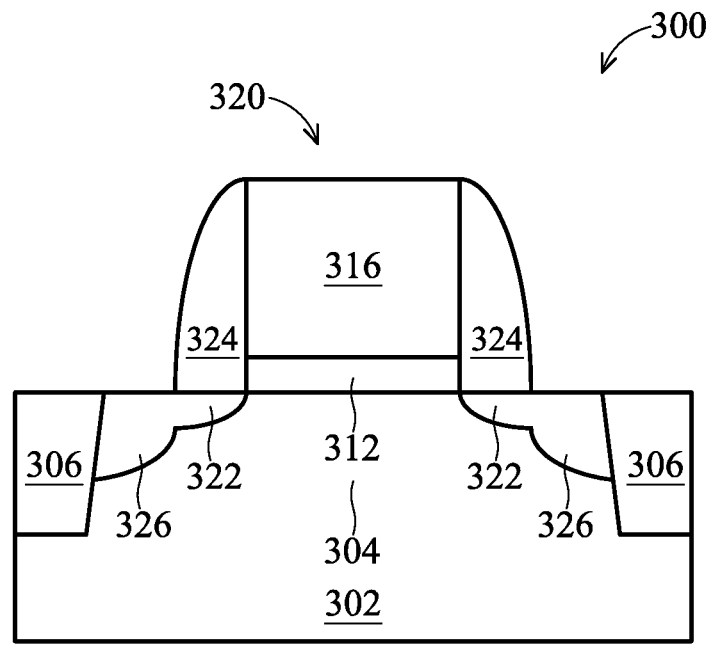

Referring to FIG. 3E, a nitrogen-containing dielectric layer, such as silicon nitride or silicon oxynitride, is formed to surround the gate structure 320. The nitrogen-containing dielectric layer may be are formed by plasma deposition at a temperature less than 400° C. and at a pressure of about 200 mTorr to 1 Torr, using $SiH_4$, $NH_3$ and/or $N_2O$ as reaction gases. Then, an anisotropic etching is performed on the nitrogen-containing dielectric layer to form gate spacers 324 on two sides of the gate structure 320. The gate spacers 324 comprise a thickness in the range of about 7 nm to about 15 nm. The gate spacers 324 may comprise a multilayer structure.

Still referring to FIG. 3E, the gate spacers 324 may be used to offset source/drain (S/D) regions 326. The S/D regions 326 may be formed in the active regions 304 of the substrate 302 by one or more ion implantation processes. The doping species may depend on the type of device being fabricated, such as an NMOS or PMOS device. For example, the S/D regions 326 may doped with p-type dopants, such as boron or $BF_2$; n-type dopants, such as phosphorus or arsenic; and/or combinations thereof. The S/D regions 326 may comprise various doping profiles, and the S/D regions 326 may be aligned with an outer edge of the spacers 324 following the ion implantation process. The S/D regions 326 may further include raised S/D regions in some embodiments. Also, one or more contact features (e.g., silicide regions) may be formed on the S/D regions 326 by a self-aligned silicidation process.

Figure 3F:
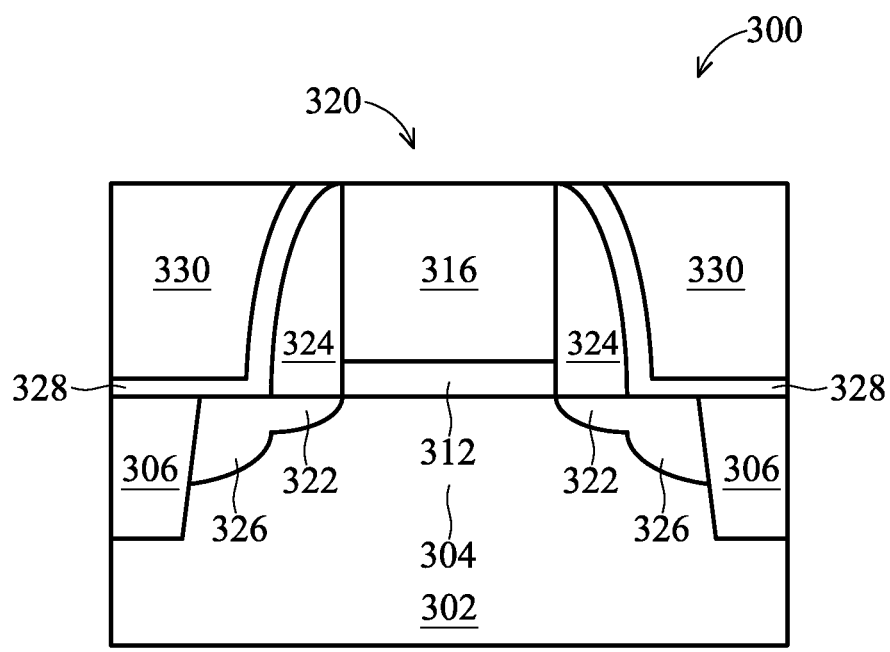

Referring to FIG. 3F, a contact etch stop layer (CESL) 328 may be formed over the substrate 302, including over the gate structure 320. The CESL 328 may be formed of silicon oxide, silicon nitride, silicon oxynitride, or combinations thereof. In the present embodiment, the CESL 328 is formed of silicon nitride (e.g., SiN) by a plasma enhanced CVD (PECVD) mixed frequency process. For example, the mixed frequency method includes supplying a source chemical such as $SiH_4$ and/or $Si_2Cl_6$ and $NH_3$ at a temperature of about 300° C. to 600° C., under a pressure of about 50 mTorr to 5 Torr and high frequency RF powers of about 70 W to 300 W and low frequency RF powers of about 5 W to 60 W. In the present embodiment, the CESL 328 comprises a thickness of about 200 Å. In some embodiments, the CESL 328 is not used.

An inter-layer dielectric (ILD) layer 330 may be formed over the CESL 328. The ILD layer 330 may comprise a dielectric material. The dielectric material may comprise silicon oxide, spin-on glass (SOG), fluorinated silica glass (FSG), carbon doped silicon oxide (e.g., SiCOH), BLACK DIAMOND® (Applied Materials of Santa Clara, Calif.), other suitable dielectric materials, and/or combinations thereof. In some embodiments, the ILD layer 330 may include a high density plasma (HDP) dielectric material and/or a high aspect ratio process (HARP) dielectric material. In the present embodiment, the ILD layer 330 comprises a thickness in the range of about 4000 Å to about 8000 Å. It is understood that the ILD layer 330 may comprise one or more dielectric materials and/or one or more dielectric layers.

Subsequently, the CESL 328 and/or ILD layer 330 may be planarized by a chemical-mechanical-polishing (CMP) process until a top portion of the dummy gate electrode layer 316 is exposed. The CMP process may have a high selectivity to provide a substantially planar surface for the dummy gate electrode layer 316, gate spacers 324, CESL 328, and ILD layer 330. In the present embodiment, the gate structure 320 may be surrounded with dielectric comprising the gate spacers 324, CESL 328, and ILD layer 330.

Figure 3G:
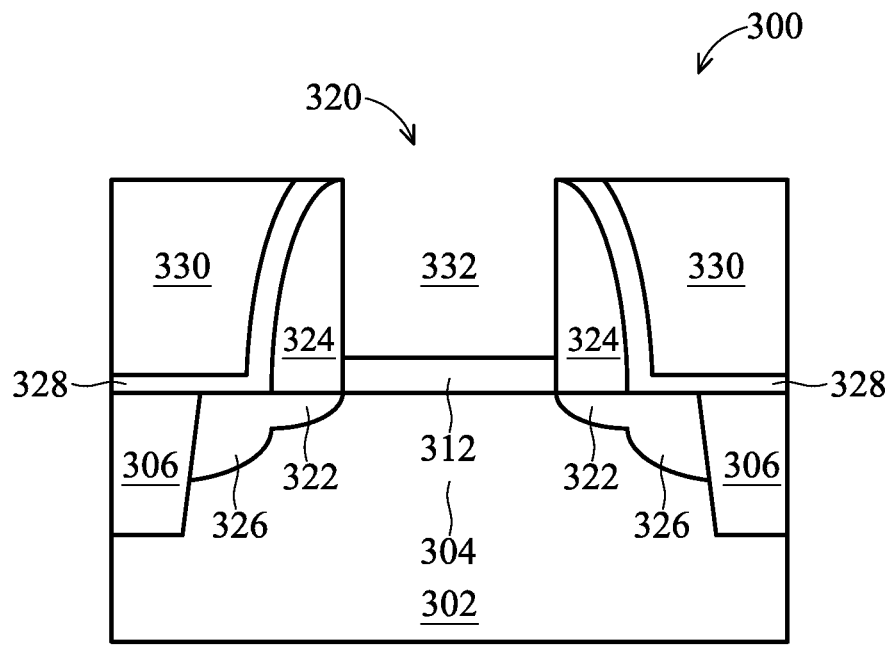
Figure 3H:
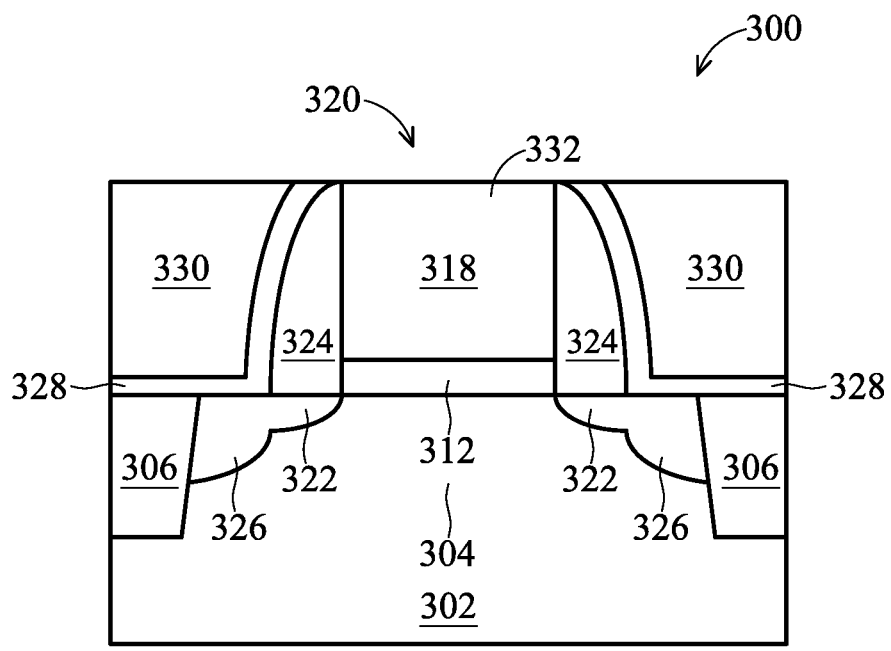

Referring to FIG. 3G, the dummy gate electrode layer 316 may be removed from the gate structure 320 to form an opening 332 in the gate spacers 324 by any suitable process. The dummy gate electrode layer 316 may be removed using a wet etch and/or a dry etch process. In one embodiment, the wet etch process for dummy poly-silicon gate electrode layer 316 includes exposure to a hydroxide solution containing ammonium hydroxide, diluted HF, deionized water, and/or other suitable etchant solutions. In other embodiment, the dry etch process for dummy poly-silicon gate electrode layer 316 may be performed under a source power of about 650 to 800 W, a bias power of about 100 to 120 W, and a pressure of about 60 to 200 mTorr, using $Cl_2$, HBr and He as etching gases.

Referring to FIG. 3H, a metal gate electrode layer 318 may be deposited to completely fill the opening 332 to form the gate structure 320. In some embodiments, the metal gate electrode layer 318 comprises a material selected from a group of Al, Cu, TiN, TiAlN, TiCN, TaN, TaCN, WN and WCN. In some embodiments, the metal gate electrode layer 318 has a gate length less than 32 nm in the opening 332. And then, a CMP process may be performed to planarize the metal gate electrode layer 318. The CMP process may remove a portion of the metal gate electrode layer 318 until the top surface of the ILD layer 330 is reached. Then, subsequent processes, including interconnect processing, must be performed after forming the metal gate electrode layer 318 of the gate structure 320 to complete the semiconductor device 300 fabrication.

While the preferred embodiments have been described by way of example it is to be understood that the disclosure is not limited to the disclosed embodiments. To the contrary, it is intended to cover various modifications and similar arrangements (as would be apparent to those skilled in the art). Therefore, the scope of invention should be accorded the broadest interpretation so as to encompass all such modifications and similar arrangements. The disclosure can be used to form or fabricate a high-k gate dielectric layer for Field-Effect Transistors. In this way, no unwanted silicon oxide is formed on top surface of the substrate to increase effective thickness of the high-k gate dielectric layer.

What is claimed is:

1. A method for fabricating a high-k dielectric layer, comprising:
    forming a high-k dielectric layer over a substrate;
    forming an oxygen-containing layer without metallic element on the high-k dielectric layer by an atomic layer deposition process; and
    performing an inert plasma treatment on the oxygen-containing layer to drive oxygen radicals into the high-k dielectric layer for filling vacancies and replacing impurities therein.

2. The method of claim 1, wherein the atomic layer deposition process comprises a sequence of ALD cycles.

3. The method of claim 1, wherein the step of forming a high-k dielectric layer over a substrate is performed using an atomic layer deposition process.

4. The method of claim 1, wherein the step of forming a high-k dielectric layer comprises forming the high-k dielectric layer with a thickness of between about 1 nm and about 4 nm.

5. The method of claim 1, wherein an oxygen source chemical of the oxygen-containing layer comprises a material selected from the group consisting of $O_2$, $O_3$, $H_2O$, and $H_2O_2$.

6. The method of claim 1, wherein the steps of forming a high-k dielectric layer over a substrate and forming an oxygen-containing layer on the high-k dielectric layer by an atomic layer deposition process are performed using different oxygen source chemicals.

7. The method of claim 1, wherein the step of performing an inert plasma treatment on the oxygen-containing layer is performed using at least one of $N_2$, Ar, or He as a source gas.

8. The method of claim 1, wherein the step of performing an inert plasma treatment on the oxygen-containing layer is performed under a source power of between about 20 W and 500 W.

9. The method of claim 1, wherein the step of performing an inert plasma treatment on the oxygen-containing layer is performed under a pressure of between about 100 mTorr and 10 Torr.

10. A method for fabricating a gate dielectric layer in a semiconductor device, comprising:
    forming a hafnium oxide layer as the gate dielectric layer over a substrate by a first atomic layer deposition process;
    forming an oxygen-containing layer without metallic element on the hafnium oxide layer by a second atomic layer deposition process; and
    performing an inert plasma treatment on the oxygen-containing layer to drive oxygen radicals into the hafnium oxide layer for filling vacancies and replacing impurities therein.

11. The method of claim 10, wherein a hafnium source chemical of the first atomic layer deposition process is selected from the group consisting of HfCl4, TEMAH (tetraethyl-methyl amino hafnium) or Hf(MMP)$_4$ [tetra(1-methoxy-2-methyl2-propoxy)Hf].

12. The method of claim 10, wherein an oxygen source chemical of the first atomic layer deposition process is selected from the group consisting of $O_2$, $O_3$, $H_2O$, and $H_2O_2$.

13. The method of claim 10, wherein the step of forming a hafnium oxide layer comprises forming the hafnium oxide layer with a thickness of between about 1 nm and about 4 nm.

14. The method of claim 10, wherein the first atomic layer deposition process comprises a sequence of ALD cycles.

15. The method of claim 10, wherein the second atomic layer deposition process comprises a sequence of ALD cycles.

16. The method of claim 10, wherein the first atomic layer deposition process and the second atomic layer deposition process are performed using different oxygen source chemicals.

17. The method of claim 10, wherein an oxygen source chemical of the oxygen-containing layer comprises a material selected from the group consisting of $O_2$, $O_3$, $H_2O$ and $H_2O_2$.

18. The method of claim 10, wherein the step of performing an inert plasma treatment on the oxygen-containing layer is performed using N2, Ar, or He as a source gas.

19. The method of claim 10, wherein the step of performing an inert plasma treatment on the oxygen-containing layer is performed under a source power of between about 20 and 500 W.

20. The method of claim 10, wherein the step of performing an inert plasma treatment on the oxygen-containing layer is performed under a pressure of between about 100 mTorr and 10 Torr.

* * * * *